(12) United States Patent
Oskam et al.

(10) Patent No.: US 6,309,969 B1
(45) Date of Patent: Oct. 30, 2001

(54) COPPER METALLIZATION STRUCTURE AND METHOD OF CONSTRUCTION

(75) Inventors: Gerko Oskam; Peter C. Searson; Philippe M. Vereecken; John G. Long; Peter M. Hoffmann, all of Baltimore, MD (US)

(73) Assignee: The John Hopkins University, Baltimore, MD (US)

( * ) Notice: Subject to any disclaimer, the term of this patent is extended or adjusted under 35 U.S.C. 154(b) by 0 days.

(21) Appl. No.: 09/184,579

(22) Filed: Nov. 3, 1998

(51) Int. Cl.$^7$ .................................................. H01L 21/44
(52) U.S. Cl. ..................... 438/687; 205/291; 205/497; 205/574
(58) Field of Search .................... 438/687; 205/291, 205/292, 497, 498, 507, 508, 574, 575

(56) References Cited

U.S. PATENT DOCUMENTS

| | | |
|---|---|---|
| 3,725,220 | 4/1973 | Kessler et al. . |
| 4,085,017 | * 4/1978 | Henrie et al. .................... 204/123 |
| 4,139,426 | 2/1979 | Schmidt . |

(List continued on next page.)

OTHER PUBLICATIONS

S.M. Sze, "Physics of Semiconductor Devices", John Wiley & Sons, 1984, copyright 1981.*
"Back to the Future: Copper Comes of Age" in: *IBM Research Magazine*; May 20, 1998; pp. 1–6.
Zuckerman, Laurence, "I.B.M. to Make Smaller and Faster Chips" in *The New York Times*; Sep. 22, 1997.
Edelstein, D, et al., "Full Copper Wiring in a Sub–0.25 um CMOS ULSI Technology" in *IEEE International Electron Devices Meeting*; (1997), pp. 773–776.
Wang, S.Q., "Barriers Against Copper Diffusion into Silicon and Drift Through Silicon Dioxide" in: *MRS Bulletin*, (Aug. 1994), pp. 30–40.
Dubin, V.M., et al., "Selective and Blanket Electroless Copper Deposition for Ultralarge Scale Integration" in: *J. Electrochem. Soc.*, (Mar. 1997), vol. 144, No. 3, pp. 898–908.

(List continued on next page.)

*Primary Examiner*—Olik Chaudhuri
*Assistant Examiner*—Ginette Peralta
(74) *Attorney, Agent, or Firm*—Dickstein Shapiro Morin & Oshinsky LLP

(57) ABSTRACT

The invention is directed to the use of copper as via and interconnect structures for an integrated circuit. The process in accordance with a preferred embodiment produces an interconnect layer of continuous copper with superior adhesion while requiring only a minimum number of steps for its production. This process addresses the current need in semiconductor manufacturing for reliable and performance-oriented vias and interconnect structures, while not being susceptible to many of the problems which plague the use of aluminum for similar structures. Fabrication of an integrated circuit in accordance with a preferred embodiment of the invention begins with the formation of semiconductor devices on a silicon wafer. Next, an intermetallic dielectric layer (IDL) is formed by materials such as silicon dioxide ($SiO_2$), polymide, or silicon nitride over the devices. This step is followed by the laying of a diffusion barrier layer on the IDL surface. The resulting product is then exposed to an electrochemical deposition or electroplating stage for the formation of a copper layer directly on top of the diffusion barrier layer. In accordance with a preferred embodiment of the invention, a variable voltage is applied to the electrochemical process in two different stages. The first stage produces nucleation of a high density of clusters and the second stage permits diffusion limited growth of the clusters so as to produce a continuous copper film layer.

15 Claims, 6 Drawing Sheets

U.S. PATENT DOCUMENTS

| | | | |
|---|---|---|---|
| 4,153,518 | * 5/1979 | Holmes et al. | 204/38 B |
| 4,468,293 | * 8/1984 | Polan et al. | 204/27 |
| 4,490,219 | 12/1984 | Bindra et al. . | |
| 4,540,473 | * 9/1985 | Bindra et al. | 204/52 R |
| 4,898,647 | 2/1990 | Luce et al. . | |
| 5,000,827 | 3/1991 | Schuster et al. . | |
| 5,151,168 | 9/1992 | Gilton et al. | 205/123 |
| 5,256,274 | 10/1993 | Poris . | |
| 5,277,789 | * 1/1994 | Kounaves et al. | 205/238 |
| 5,415,761 | 5/1995 | Müll . | |
| 5,421,966 | * 6/1995 | Oxley | 204/94 |
| 5,633,047 | 5/1997 | Brady et al. | 427/437 |
| 5,700,726 | * 12/1997 | Huang et al. | 437/643 |
| 5,736,457 | * 4/1998 | Zhao | 438/624 |
| 5,744,376 | 4/1998 | Chan et la. | 437/190 |
| 5,783,483 | 7/1998 | Gardner | 438/627 |
| 5,801,444 | 9/1998 | Aboelfotoh et al. | 257/762 |
| 5,882,498 | * 3/1999 | Dubin et al. | 205/261 |
| 5,893,752 | * 4/1999 | Zhang et al. | 438/687 |
| 5,906,725 | * 5/1999 | Lin et al. | 205/240 |
| 5,933,753 | * 8/1999 | Simon et al. | 438/629 |
| 5,968,333 | * 10/1999 | Nogami et al. | 205/184 |

OTHER PUBLICATIONS

Ng, H.T., et al., "Sequential Observation of Electroless Copper Deposition via Noncontact Atomic Force Microscopy" in *J. Electrochem. Soc.*, (Sep. 1998), vol. 145, No. 9, pp. 3301–3307.

Yung, E.K., et al., "Plating of Copper into Through–Holes and Vias" in: *J. Electrochem. Soc.*, (Jan. 1989), vol. 136, No. 1, pp. 206–215.

West, A.C., et al., "Pulse Reverse Copper Electrodeposition in High Aspect Ratio Trenches and Vias" in: *J. Electrochem. Soc.*, (Sep. 1998), vol. 145, No. 9, pp. 3070–3074.

Rhoderick, E.H., et al., *Metal–Semiconductor Contacts*. Oxford, New York, 1988.

Greef, R., et al., *Instrumental Methods in Electrochemistry*. Ellis Horwood Limited, 1985.

Oskam, G., et al., "Electrochemical Deposition of Metals On Semiconductors" in: *Materials Research Society, Symp. Proc.*, (1997), vol. 451, pp. 257–265.

Quickenden, T.I., et al., "Toward a Reliable Value for the Diffusion Coefficient of Cupric Ion in Aqueous Solution" in: *J. Electrochem. Soc.*, (Apr. 1996), vol. 143, No. 4, pp. 1248–1253.

Gunawardena, G., et al., "Electrochemical Nucleation" in *J. Electroanal. Chem.*, (1982), vol. 138, pp. 225–237.

Scharifker, B., et al., "Theoretical And Experimental Studies Of Multiple Nucleation" in: *Electrochim. Acta*, (1983), vol. 25, No. 7, pp. 879–889.

Volmer, M., *Kinetics of Phase Formation*. Steinkopff, Dresden, 1939.

Budevski, E., et al., *Electrochemical Phase Formation and Growth*. VCH, Weinheim 1996.

Oskam, G., et al., "Electrochmeical Deposition of Metals onto Silicon" in: *J. Phys. D.: Appl. Phys.*, (1998), vol. 31, pp. 1927–1949.

Brady, R.M., et al., "Fractal Growth of Copper Electrodeposits" in: *Nature* (May 17, 1984), vol. 309, pp. 225–229.

* cited by examiner

COPPER METALLIZATION STRUCTURE AND METHOD OF CONSTRUCTION

GOVERNMENT INTEREST

This invention was made with government support under Grant No. CTS-9732782 awarded by the National Science Foundation. The government has certain rights in the invention.

BACKGROUND OF THE INVENTION

The performance characteristics and reliability of integrated circuits has become increasingly dependent upon the structure and attributes of the vias and interconnects which are used to carry electronic signals between semiconductor devices on an integrated circuit or chip. Advances in the fabrication of integrated circuits have resulted in increases in the density and number of semiconductor devices contained on a typical chip. However, the technology of interconnect structure and formation has lagged behind these advances and is now a major contributor to limitations on signal speed in integrated circuits. The resultant need for thinner, shorter, and faster interconnects has become a major concern in the field of integrated circuit manufacture.

Integrated circuits are generally constructed from a silicon wafer which contains numerous semiconductor devices such as capacitors and transistors. Vias and interconnects allow electrical charge to be transferred from one semiconductor device to another on a single chip. Current fabrication techniques for these structures consist of preparing the surface of the silicon wafer by formation of an intermetallic dielectric layer (IDL), most commonly silicon dioxide ($SiO_2$). This is followed by the creation of a mask of the desired interconnect structure, depositing the interconnect material (e.g., aluminum) on the IDL, and then removing the mask leaving a metal interconnect structure. Another typical method is to form the metal layer over the IDL allowing the interconnect structures to fill and then removing the excess metal through chemical mechanical polishing methods. Aluminum has been, historically, the preferred metal for use in the construction of integrated circuit interconnects.

Aluminum is widely used in the semiconductor industry because it is an inexpensive metal which is relatively easy to etch and offers good adhesion to an $SiO_2$ IDL. However, aluminum exhibits significant electromigration effects and is generally susceptible to humidity-induced corrosion as well as to the formation of cracks or spaces between the metal layer and the IDL due to large variance in the coefficients of thermal expansion between the two materials, a process commonly known as "cold creep." Electromigration, the susceptibility of a metal to open circuit and void effects, and "cold creep" of aluminum have become more of a concern to chip designers as the desired width of metallization decreases in integrated circuits.

The problems associated with aluminum have become markedly pronounced as the geometry of integrated circuitry continues to shrink. This has led to attempts to utilize different materials to construct an interconnect system having the chemical and mechanical properties which will complement and enhance smaller and faster circuit systems. The ideal interconnect material in an integrated circuit would be an inexpensive material exhibiting the characteristics of low resistivity, minimal electromigration, possessing a similar coefficient of thermal expansion to the substrate material, and resistance to corrosion. Research has generally centered around the use of gold, silver, and copper as via and interconnect materials given their beneficial properties in one or more of these areas.

Of the various materials available, copper is perhaps the most attractive for use in integrated circuits because of its desirable chemical and mechanical properties. It is an excellent conductor with a resistivity of 1.73 micro-ohms/cm, available for low cost, and can be easily processed. Copper also exhibits far fewer electromigration effects than aluminum and therefore can carry a higher maximum current density; thus permitting faster transport of electrons. Copper's high melting point and ductility combine to produce far less "cold creep" during the semiconductor fabrication process than many other metals, including aluminum.

Although copper may be ideally suited to the fabrication of integrated circuits, it also exhibits several fabrication problems for designers. As described above, an integrated circuit is produced by initially creating a silicon wafer which contains a multitude of semiconductor devices. Next an IDL layer, generally of $SiO_2$, is formed. In contrast to aluminum, copper is soluble in silicon and most common IDLs and exhibits a high rate of diffusion at temperatures associated with integrated circuit manufacturing. This diffusion can result in the creation of intermetallic alloys which can cause the active semiconductor devices in the silicon substrate to malfunction, rendering the integrated circuit impotent. In addition, copper exhibits poor adhesion to $SiO_2$ which can result in the failure of electrical contacts through broken connections.

To use copper successfully in a silicon-based integrated circuit, an intermediate "diffusion" barrier layer must be placed between the IDL and the copper interconnect. Such a barrier is intended to eliminate the diffusion which would otherwise occur at the copper-IDL junction and, thus, prevent the copper from altering the electrical characteristics of the silicon-based semiconductor devices. Such a diffusion barrier is well known in the art and may be formed of a variety of transition metals, transition metal alloys, transition metal silicides, metal nitrides, and ternary amorphous alloys. The most common diffusion barriers in use are titanium nitride (TiN) and titanium-tungsten alloy due to their demonstrated ability to effectively reduce copper diffusion.

The next step is to deposit a copper layer onto the surface of the diffusion barrier. However, current methods for the deposition of copper onto the barrier layer have proven insufficient to produce adhesive copper interconnect structures with proper step coverage for today's integrated circuit applications. Prior methods that have been proposed to develop a copper interconnect layer involve numerous process steps and various treatments to obtain useable electronic signal paths. These methods have proven insufficient to address the demands of modern integrated circuit fabrication.

Deposition of metallization generally occurs through one or a combination of the following techniques: chemical vapor deposition (CVD), physical vapor deposition (PVD) (e.g., sputtering, evaporation, etc.), or electrochemical deposition. Aluminum is generally deposited through sputtering or CVD. The decreasing size of the component structure of silicon-based chips has highlighted the difficulty inherent in obtaining sufficient coverage and density from sputtering alone. CVD involves moderate to high temperatures which can lead to cold creep effects and an increased chance of impurity contamination over other methods. Therefore, electrochemical deposition offers the most precise control over the microstructure and a process which can be performed at room temperature and atmospheric pressure. This translates into the possibility for thorough coverage, less physical flaws, and a reduction in the possibility of separation due to differing coefficients of thermal expansion.

However, electrochemical deposition processes used to deposit copper directly onto a diffusion barrier have thus far been insufficient to produce an interconnect layer on an integrated circuit that exhibits reliable and high speed performance characteristics. Processes involving the direct electrochemical deposition of copper onto the barrier layer have generally resulted in films with voids and other defects. One such process, described in U.S. Pat. No. 5,151,168 (Gilton et al.), utilizes a bath in which copper ions are complexed with EDTA at a pH of 13.5. Electrochemical deposition of copper onto a barrier layer can result in insufficient cluster densities which do not allow coalescing of the clusters for film growth or produce a copper "dust" which exhibits little or no adhesion.

Further attempts to utilize electrochemical deposition of copper involve forming intermediate layers, as shown in FIG. 6. As shown, an integrated circuit can be formed using a silicon wafer 100, an intermetallic dielectric layer 102, and a diffusion barrier layer 104. To produce an adhesive surface, a copper seed layer 150 is deposited through a CVD process like that described in Edelstein, *Proc. IEEE International Electron Devices Meeting (IEDM)*, 43, 773 (1997), which is incorporated herein by reference. After the CVD process, the integrated circuit is then placed in an electrolyte bath to undergo electrochemical deposition of a final copper layer 152 over seed layer 150. This method, however, is undesirable as it increases production costs and contamination rates by the use of multiple, non-reversible deposition steps.

Low temperature annealing has also been utilized after the deposition of copper onto a diffusion barrier layer. This method, however, increases the possibility of negative "cold creep" effects as well as a failure to provide a consistent and dense copper structure.

SUMMARY OF THE INVENTION

The invention is directed to the use of copper as via and interconnect structures for an integrated circuit. The process in accordance with a preferred embodiment produces an interconnect layer of continuous copper with superior adhesion while requiring only a minimum number of steps for its production. This process addresses the current need in semiconductor manufacturing for reliable and performance-oriented vias and interconnect structures, while not being susceptible to many of the problems which plague the use of aluminum for similar structures.

Fabrication of an integrated circuit in accordance with a preferred embodiment of the invention begins with the formation of semiconductor devices on a silicon wafer. Next, an intermetallic dielectric layer (IDL) is formed by materials such as silicon dioxide ($SiO_2$), polymide, or silicon nitride over the devices. This step is followed by the laying of a diffusion barrier layer on the IDL surface. The resulting product is then exposed to an electrochemical deposition or electroplating stage for the formation of a copper layer directly on top of the diffusion barrier layer. In accordance with a preferred embodiment of the invention, a variable voltage is applied to the electrochemical process in two different stages. The first stage produces nucleation of a high density of copper clusters and the second stage permits growth of the clusters so as to produce a continuous copper film layer.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

The invention will be described in detail with reference to the preferred embodiments illustrated in FIGS. 1–5. The invention is described herein in its preferred application to the formation of vias and interconnect structures for semiconductor electronic devices. However, the invention may be applicable to any type or configuration of integrated circuit or layered structure that encounters the same or similar problems overcome by the invention described herein.

Figure 1:
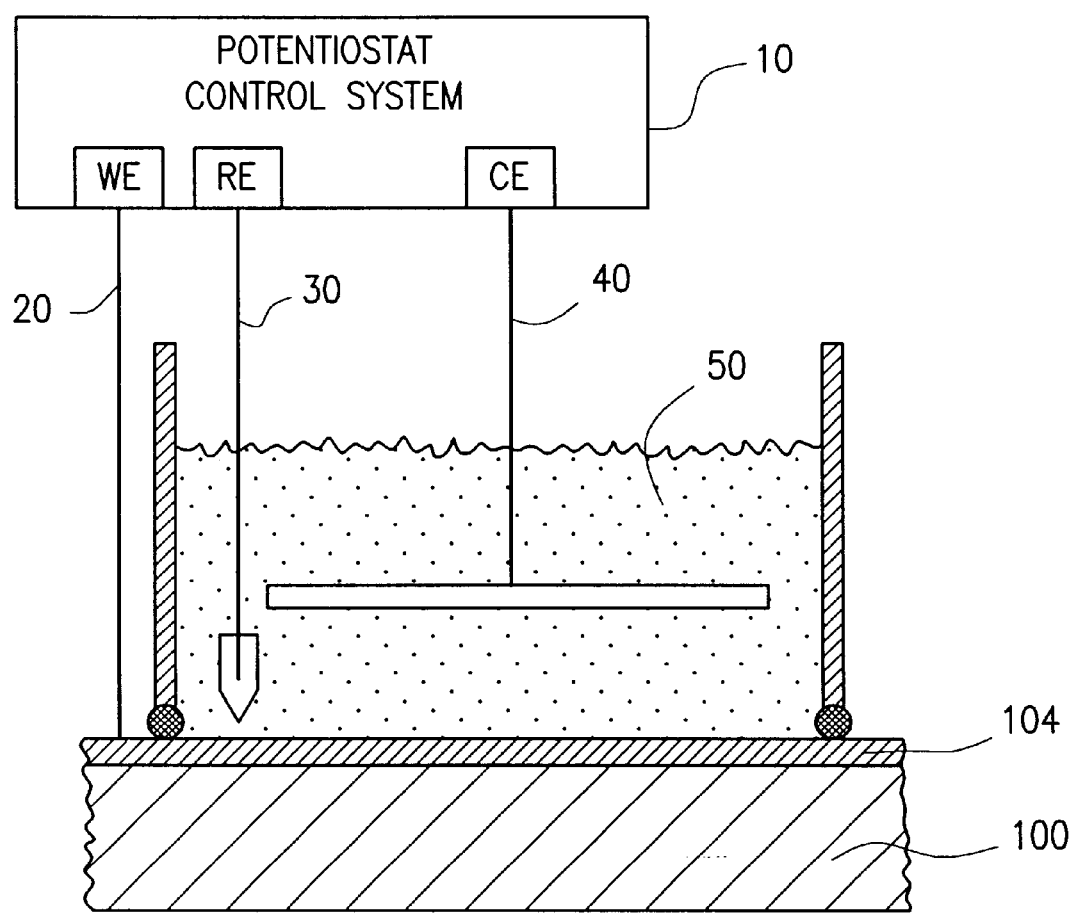
FIG. 1 is a cross-sectional view of the electrochemical cell used to prepare a conductive layer in accordance with a preferred embodiment of the invention

In accordance with a preferred embodiment of the invention, before a conductive layer made of a metal such as copper can be formed on a substrate made of a material such as silicon, a boundary layer in the form of a diffusion barrier must be laid over the substrate. As shown in FIG. 1, diffusion barrier layer 104 is formed on the top surface of substrate 100 to substantially prevent the conductive layer from diffusing into substrate 100. The diffusion barrier may be any of a variety of materials known in the art such as transition metals, transition metal alloys, transition metal silicides, metal nitrides, ternary amorphous alloys, etc. Barrier layer 104 is preferably formed by use of CVD, sputtering, or other deposition techniques known in the art. In the preferred embodiment, the diffusion barrier layer is prepared using titanium nitride (TiN) at a thickness of approximately 20–40 nm, preferably 30 nm, through an RF sputtering deposition process. The exact parameters of the process (e.g., conducted at room temperature for approximately one minute at an RF voltage of approximately 620) may vary depending on the requirements of the properties desired.

An ohmic contact may optionally be made to the surface of wafer 100 (either the backside of wafer 100 or to the TiN layer) to avoid problems, e.g., sheet resistance, inherent in the TiN film used to form barrier layer 104. The contact is preferably an In/Ga eutectic, but may be any known material used to provide ohmic contact.

To deposit the conductive layer (e.g., copper film) directly on the diffusion layer 104 without any need for a seed layer (as typically used in the art), a specific electrochemical or electroplating process is performed in accordance with the invention preferably using the electrochemical cell shown in FIG. 1. The electrolytic bath 50 used contains copper ions such as an aqueous solution with an ion concentration ranging between 0.001 to 1.0 M $Cu^{2+}$, preferably 50 mM $Cu^{2+}$. The solution may be prepared from a variety of sources, for example, from 25 mM $CuCO_3$ $Cu(OH)_2$ with 0.32 M $H_3BO_3$ and 0.18 M $HBF_4$. This bath typically has a pH in the range of 1.0 to 2.0, preferably of approximately 1.4. A pyrophosphate solution, $Cu_2P_2O_7$ with $K4P_2O_7$, $KNO_3$, may also be used when adjusted to a pH in the range of 8.0 to 8.7 through addition of $NH_4OH$. Additives such as surfynol or other various known additives, may also be used in the bath to improve the properties of the deposit. For example, in the preferred embodiment, 0.1 volume percent of surfynol ("surfynol 465 surfactant" from Air Products and Chemicals, Inc.) can be added. The deposition can be performed in the temperature range from 15° C. to 60° C., preferably at room temperature.

The electrochemical deposition of copper in accordance with a preferred embodiment of the invention is particularly performed in two stages. The integrated circuit consisting of the wafer 100 and barrier layer 104 as constructed above is placed in the electrolyte bath 50. As is well known in the art, the bath may resemble the basic three electrode cell structure utilized to perform electrochemical depositions, as shown in FIG. 1. The reference electrode 30 is positioned so that its tip is directly over the region of interest on the planar surface of barrier layer 104, as shown in FIG. 1. Reference electrode 30, preferably made of silver/silver chloride [Ag/AgCl (3 M NaCl)], may be lowered to close proximity of the barrier layer 104 using a capillary or the like to minimize ohmic potential drops. Reference electrode 30 preferably has a potential of 0.22 V versus the standard hydrogen electrode. Other reference electrodes known in the art may be used and the potentials for deposition would then be relative to the reference electrode chosen. The counter electrode, or current collector 40, is preferably constructed of platinum gauze. In the preferred embodiment, working electrode 20 contacts barrier layer 104 (or alternatively, wafer 100). A potentiostat-based control system 10 (or like system) is provided to control the electrochemical process in accordance with the invention.

Figure 2A:
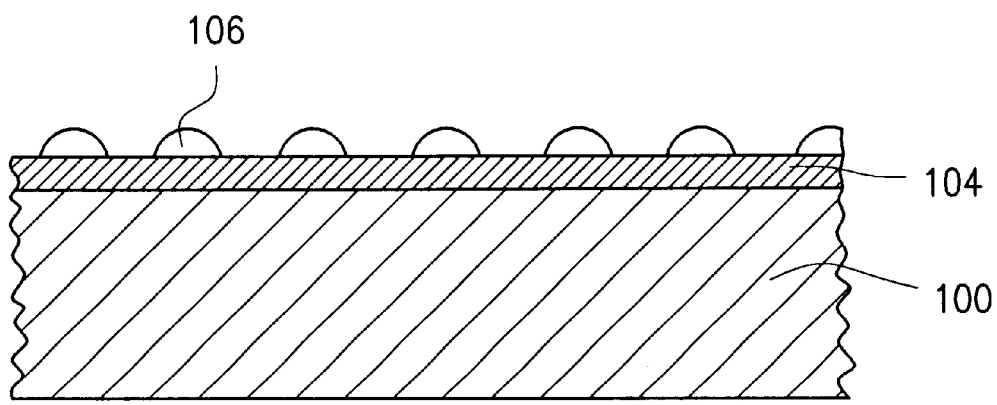
FIG. 2a is a cross-sectional view of an in-process structure in accordance with a preferred embodiment of the invention during a first stage of the electrochemical deposition process.
Figure 2B:
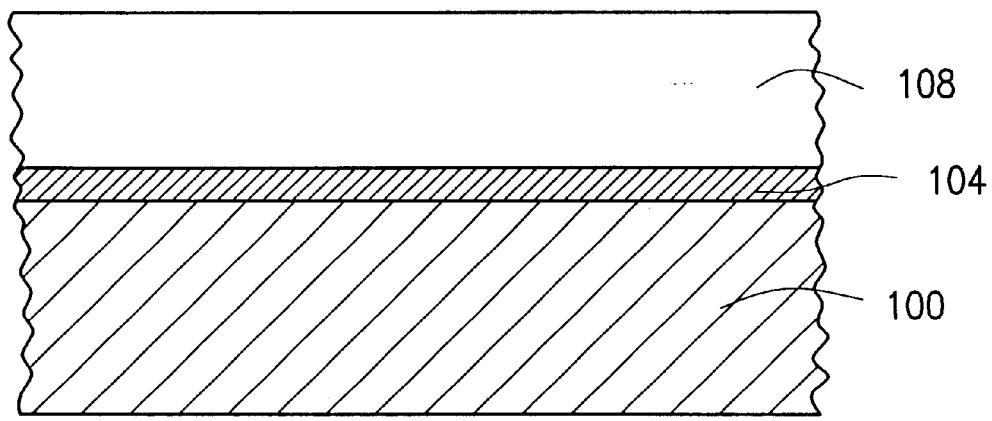
FIG. 2b is a cross-sectional view of the structure of FIG. 1 formed in accordance with a preferred embodiment of the invention after the second stage of the electrochemical process.

The first phase of the electrochemical deposition process is the application of a potential such that a high density of copper clusters 106 are formed as shown in FIG. 2a. The potential applied in the first phase is a negative potential relative to reference electrode 30 and may be in the range from −0.4 V to −1.0 V dependent upon the size and density of clusters 106 desired. The second phase produces the structure shown in FIG. 2b through application of a more positive potential to produce growth of a continuous planar copper layer 108. The potential applied in the second phase may be in the range from −0.10 V to +0.05 V dependent upon the copper ion concentration in the bath and whether the deposition is controlled by kinetic or mixed processes.

Kinetic control, a charge transfer limiting process occurring at lower potentials, produces smooth, continuous, and adherent copper films. Mixed control, a combination of charge transfer and diffusion processes occurring at more negative potentials than for kinetic control, produces increased deposition rates. The degree to which the process is performed under kinetic and/or mixed control will determine the rate of deposition, and consequently the surface texture, and the density and thickness of the final copper layer 108. Potentials between −0.10 V and +0.05 V result in kinetic/mixed control so that film characteristics and the rate of deposition may be regulated to produce a continuous copper layer 108 which provides coverage of sub-micron openings.

Because the first and second applied voltages are substantially maintained at constant or controlled voltage levels during copper film deposition in accordance with a preferred embodiment of the invention, the current may vary during the process. An alternative to this construction is to utilize during both the first and second phases a constant or controlled current method for deposition of the copper film. In this embodiment, the current is kept constant while the potential is allowed to fluctuate in range dependent upon the concentration of copper ions in the bath. Constant current electrochemical deposition produces a linear relationship between time and film thickness. Therefore, this method may preferred as it allows the thickness of the copper film to be easily controlled by setting the duration of the application of the current.

In this embodiment, the deposition would still employ a two phase process wherein the first phase would be performed at a relatively high constant current such that desired nucleus density of clusters 106 is achieved. The current applied in the first phase may be in the range from −50 $mA/cm^2$ to −500 $mA/cm^2$ dependent upon the concentration of copper ions in the bath. The current pulse may be in a range from 10 ms to 500 ms dependent upon the used current density, which is an indication of cluster growth. The second phase will result in the structure shown in FIG. 2b through application of a relatively low constant current to produce growth of a continuous planar copper layer 108. The current applied in the second phase may be in the range from −0.1 $mA/cm^2$ to −10 $mA/cm^2$ dependent upon the copper ion concentration of the bath. Similar to the constant voltage method, the thickness of the film is controlled by the time over which the second current is applied.

The constant current method described above may also be performed using a two electrode bath. In such an arrangement, only the counter electrode 40 and the working electrode 20 are used to produce electrochemical deposition. The constant current method described above may also be performed using a two electrode bath. In such an arrangement, only the counter electrode 40 and the working electrode 20 are used to produce electrochemical deposition.

Figure 3:
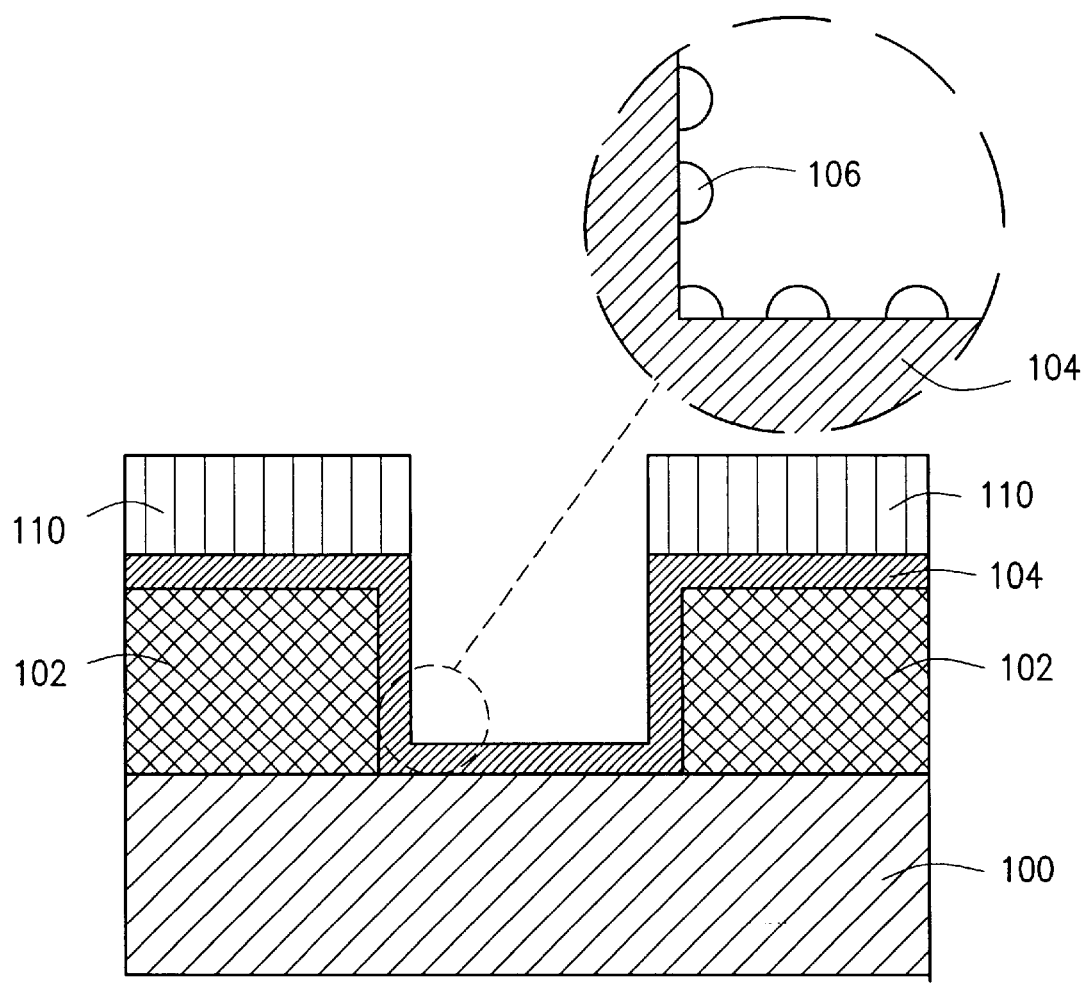
FIG. 3 is a cross-sectional view of an integrated circuit undergoing the first stage of an electrochemical deposition process in accordance with a preferred embodiment of the invention.

The foregoing novel process can easily be applied to the fabrication of an integrated circuit. As shown in FIG. 3, silicon wafer 100 represents any semiconductor device known in the art which requires connection to a metallic via or interconnect. In a preferred embodiment of the invention, an intermetallic dielectric layer 102 is formed on n-type silicon wafer 100, as shown in FIG. 3. The intermetallic dielectric layer 102 is preferably silicon dioxide ($SiO_2$) but may be any of a wide variety of materials known in the art which have a low dielectric constant and adhere to silicon. Intermetallic dielectric layer 102 may be formed through several well known techniques such as chemical vapor deposition (CVD), physical vapor deposition (PVD), spin coating, etc. The semiconductor devices requiring metallization are patterned in intermetallic dielectric layer 102 and etched by a known method such as wet etching (or any other technique known in the art) such that a contact junction is formed. Next, the diffusion barrier layer 104 is deposited as described above to form a thin layer, preferably of TiN, that uniformly coats the contact junction.

To form the final copper film structure a variety of common masking or polishing methods may be used. Shown in FIG. 3 is masking layer 110 which may be deposited using, for example, a reverse masking method. Masking layer 110 ensures that the copper interconnect to be formed is limited to the contact junction. Masking layer 110 will be unnecessary if an alternate method of removing the excess copper deposition is used. Alternative methods include the well-known chemical-mechanical polishing and etch-back techniques.

Finally, the first stage of the electrochemical deposition process of the invention is performed as described above so that a first growth of copper nuclei 106 are formed as shown in the inset of FIG. 3. The first applied voltage is preferably pulsed at a voltage level (relative to a reference electrode in the bath) from an open circuit voltage to a voltage range of $-0.4$ V to $-1.0$ V, preferably from $-0.5$ V to $-1.0$ V, dependent upon the reference electrode chosen. The voltage is pulsed for a predetermined time period or some other condition subsequent (e.g., cluster density reaches $5\times10^8$ $cm^{-2}$), as set by the user.

The condition subsequent may vary depending on certain parameters. Where the voltage applied is between $-0.4$ V to $-0.7$ V, for example, the predetermined time for the pulse (i.e., the nucleation pulse length) is between 20 ms and 500 ms. The precise length of the pulse should be optimized for every solution used. At high concentrations of copper ions (e.g., 0.05 M to 1 M), the pulse length may be 20 ms to 100 ms, while for lower concentrations (e.g., 0.001 M to 0.05 M), the pulse duration is between 100 ms and 500 ms.

Where a predetermined period of time for the nucleation pulse length is not chosen as the condition subsequent, the time in which the first voltage terminates and the second voltage is to be applied may coincide, instead, with certain detectable conditions in the formation of the copper layer. For example, the condition subsequent may require a sufficiently large charge (e.g., between 10 and 50 mC $cm^{-2}$) be deposited as a result of the first applied voltage. The condition subsequent may also occur when a high density of nuclei (e.g., diameters of 20 nm to 150 nm) sufficient for clusters to coalesce are formed from the first applied voltage.

Figure 4:
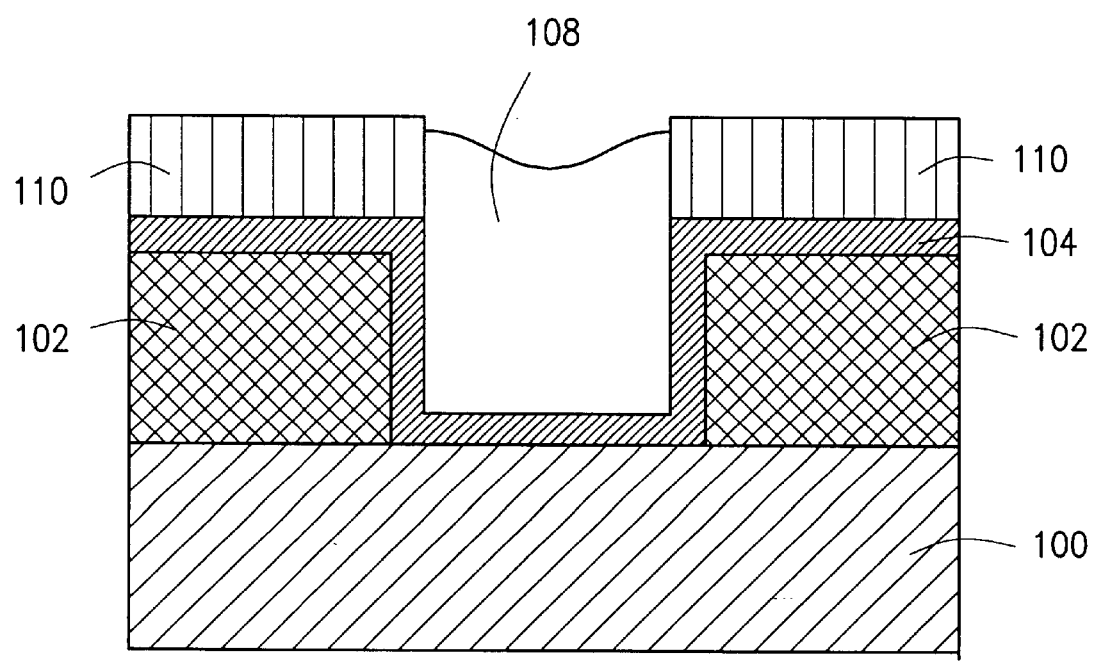
FIG. 4 is a cross-sectional view of the integrated circuit of FIG. 3 undergoing the second stage of an electrochemical deposition process in accordance with a preferred embodiment of the present invention.

Once the condition subsequent occurs, the second voltage is applied, preferably between $-0.10$ V to $+0.05$ V. Under the second applied potential, a continuous growth of copper is obtained to form copper layer 108, as shown in FIG. 4. The length of time in which the second applied voltage is maintained depends in large part on the thickness of the copper layer desired. Where the second applied voltage has a potential from $-0.10$ V to $0.05$ V, for example, the second applied voltage may be maintained for a period of 1 second to 1 hour, depending on the thickness desired. The precise period of time depends on the exact potential applied, the concentration of the copper ions in the bath, and the thickness desired. This period of time, thus, will be different for each application.

Figure 5:
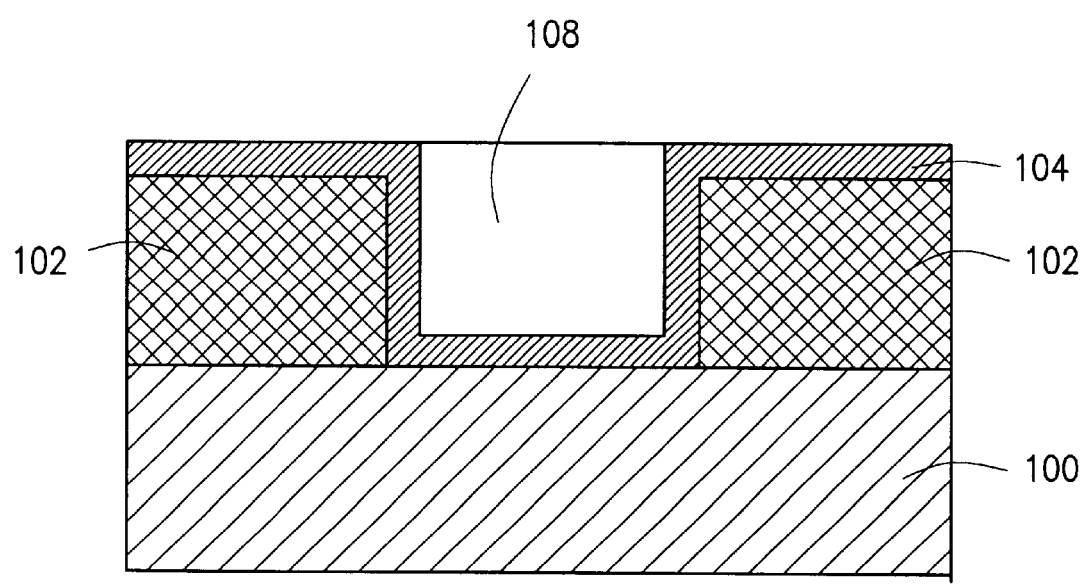
FIG. 5 is a cross-sectional view of the final copper layer formed on the integrated circuit of FIGS. 3 and 4 in accordance with a preferred embodiment of the present invention.
Figure 6:
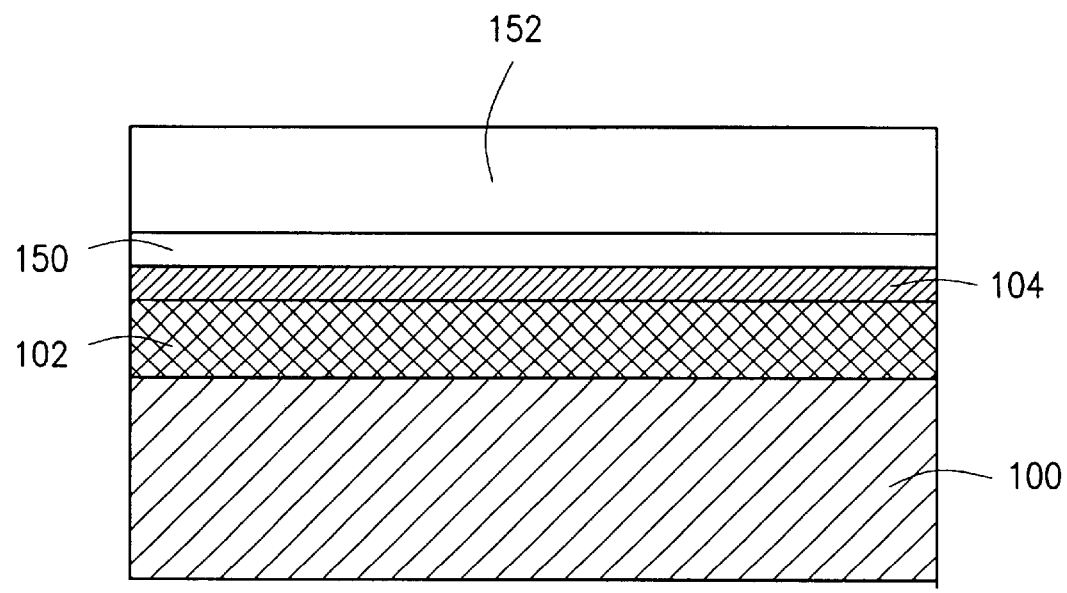
FIG. 6 is a cross-sectional view of an in-process structure having a copper layer formed in accordance with a known process utilizing an intermediate seed layer.

Depending upon the fabrication process, the integrated circuit then undergoes removal of the excess copper (i.e., copper not in the prescribed interconnect section which contacts junction) or planarization through known methods of etching or polishing to produce the structure shown in FIG. 5. The final product is an integrated circuit utilizing copper interconnects which exhibits excellent step coverage and adhesion.

It should again be noted that although the invention has been described with specific reference to silicon-based integrated circuits, the invention has broader applicability and may be used in many materials applications. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

For example, the two stage process for depositing copper may be part of a multi-stage process, or may be one of a series of copper layers that may desired on an integrated circuit. While the specific copper ion-based solutions described herein are preferred any number of equivalent solutions made used in accordance with the invention. Moreover, the example of the invention applied to the fabrication of an integrated circuit using a controlled voltage as the control parameter could easily be modified to utilize a controlled current as the control parameter to achieve the continuous copper film desired.

What is claimed as new and desired to be protected by Letters Patent of the United States is:

1. A process of fabricating a conductive layer on a substrate, the process comprising the steps of:
   preparing a boundary layer on the substrate; and
   depositing a conductive layer directly on the boundary layer without any seed layer, wherein said depositing step comprises the substeps of applying a first control parameter until a condition subsequent occurs, and applying a second control parameter after occurrence of the condition subsequent;
   wherein the semiconductor substrate is silicon, the conductive layer is a metallic material having diffusion limited by the boundary layer, wherein the boundary layer is a diffusion barrier layer, and wherein said substep of applying a first control parameter includes applying a first voltage, and said substep of applying a second control parameter includes applying a second voltage which is more positive than the first voltage.

2. The process of fabricating a conductive layer of claim 1, wherein the diffusion barrier layer is a transition metal-based material, and the conductive layer is copper.

3. The process of fabricating a conductive layer of claim 2, wherein the diffusion barrier layer is titanium nitride, and said depositing step includes passing the semiconductor substrate through an aqueous solution of copper ions.

4. A process of fabricating a conductive layer on a substrate, the process comprising the steps of:
   preparing a boundary layer on the substrate; and
   depositing a conductive layer directly on the boundary layer without any seed layer, wherein said depositing step comprises the substeps of applying a first control parameter until a condition subsequent occurs, and applying a second control parameter after occurrence of the condition subsequent;
   wherein said substep of applying a first control parameter involves application of a negative voltage sufficient to produce nucleation of a high density of hemispherical clusters to make up the conductive layer, and wherein said substep of applying a second control parameter involves increasing the applied first control parameter to a level that permits growth of the hemispherical clusters to form a continuous and adherent film.

5. The process of fabricating a conductive layer of claim 4, wherein the negative voltage is between $-0.4$ V and $-1.0$ V.

6. The process of fabricating a conductive layer of claim 5; wherein the negative voltage is increased during said substep of applying a second control parameter to a level between −0.10 V and 0.05 V.

7. The process of fabricating a conductive layer of claim 4, wherein the condition subsequent is a predetermined level of density of the hemispherical clusters formed as a result of the substep of applying a first voltage.

8. A process of fabricating a conductive layer on a substrate, the process comprising the steps of:

preparing a boundary layer on the substrate; and depositing a conductive layer directly on the boundary layer without any seed layer, wherein said depositing step comprises the substeps of applying a first control parameter until a condition subsequent occurs, and applying a second control parameter after occurrence of the condition subsequent;

wherein the first control parameter is a first current level, and the second control parameter is a second current level which is smaller than the first current level.

9. A process of depositing copper on a semiconductor substrate, the process comprising the steps of:

forming a dielectric layer on at least one surface of the semiconductor substrate;

depositing a boundary layer on the dielectric layer such that said boundary layer is capable of preventing substantial diffusion of copper; and depositing copper material directly on the boundary layer without any seed layer by utilizing an electrochemical deposition bath of copper ions through first and second applied voltage potentials such that a layer of copper is produced.

10. The process of depositing copper as recited in claim 9, wherein said step of forming a dielectric layer comprises the step of forming a layer of silicon dioxide using chemical vapor deposition.

11. The process of depositing copper as recited in claim 9, wherein said step of depositing a boundary layer comprises the step of depositing a layer of material containing titanium through RF sputtering for one minute at an RF voltage of approximately 650 Volts.

12. The process of depositing copper as recited in claim 9, wherein said step of depositing copper material involves placing the semiconductor substrate through an aqueous solution of copper ions.

13. The process of depositing copper as recited in claim 9, wherein said step of depositing copper material is an electrochemical deposition process that uses a bath having a solution with a pH in a range from 1.0 to 2.0.

14. The process of depositing copper as recited in claim 9, further comprising the step of providing an ohmic contact to said silicon wafer.

15. The process of depositing copper as recited in claim 9, wherein said step of depositing copper material on the boundary layer involves application of a first voltage in the range −0.7 V and −1 V, followed by application of a second voltage in the range −0.10 V and 0.05 V.

* * * * *